United States Patent
Tsai et al.

(10) Patent No.: US 12,044,959 B2
(45) Date of Patent: Jul. 23, 2024

(54) EUV PHOTO MASKS AND MANUFACTURING METHOD THEREOF

(71) Applicant: TAIWAN SEMICONDUCTOR MANUFACTURING CO., LTD., Hsinchu (TW)

(72) Inventors: Hung-Yi Tsai, Zhubei (TW); Wei-Che Hsieh, Taipei (TW); Ta-Cheng Lien, Cyonglin Township (TW); Hsin-Chang Lee, Zhubei (TW); Ping-Hsun Lin, New Taipei (TW); Hao-Ping Cheng, Hsinchu (TW); Ming-Wei Chen, Hsinchu (TW); Szu-Ping Tsai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/114,848

(22) Filed: Feb. 27, 2023

(65) Prior Publication Data

US 2023/0205072 A1  Jun. 29, 2023

Related U.S. Application Data

(63) Continuation of application No. 17/103,023, filed on Nov. 24, 2020, now Pat. No. 11,592,737.

(60) Provisional application No. 63/032,444, filed on May 29, 2020.

(51) Int. Cl.
*G03F 1/24* (2012.01)

(52) U.S. Cl.
CPC .................. *G03F 1/24* (2013.01)

(58) Field of Classification Search
CPC .......................................................... G03F 1/24
USPC ............................................................ 430/5
See application file for complete search history.

(56) References Cited

U.S. PATENT DOCUMENTS

| | | |
|---|---|---|
| 8,764,995 B2 | 7/2014 | Chang et al. |
| 8,796,666 B1 | 8/2014 | Huang et al. |
| 8,828,625 B2 | 9/2014 | Lu et al. |
| 8,841,047 B2 | 9/2014 | Yu et al. |
| 8,877,409 B2 | 11/2014 | Hsu et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 10,877,368 B2 | 12/2020 | Jindal |

FOREIGN PATENT DOCUMENTS

| | | |
|---|---|---|
| CN | 110837203 A | 2/2020 |
| TW | 201435485 A | 9/2014 |
| TW | 201830122 A | 8/2018 |
| WO | 2016/058822 A1 | 4/2016 |

*Primary Examiner* — Christopher G Young
(74) *Attorney, Agent, or Firm* — STUDEBAKER & BRACKETT PC

(57) ABSTRACT

A reflective mask includes a substrate, a reflective multilayer disposed on the substrate, a capping layer disposed on the reflective multilayer, and an absorber layer disposed on the capping layer. The absorber layer includes a base material made of one or more of a Cr based material, an Ir based material, a Pt based material, or Co based material, and further contains one or more additional elements selected from the group consisting of Si, B, Ge, Al, As, Sb, Te, Se and Bi.

20 Claims, 8 Drawing Sheets

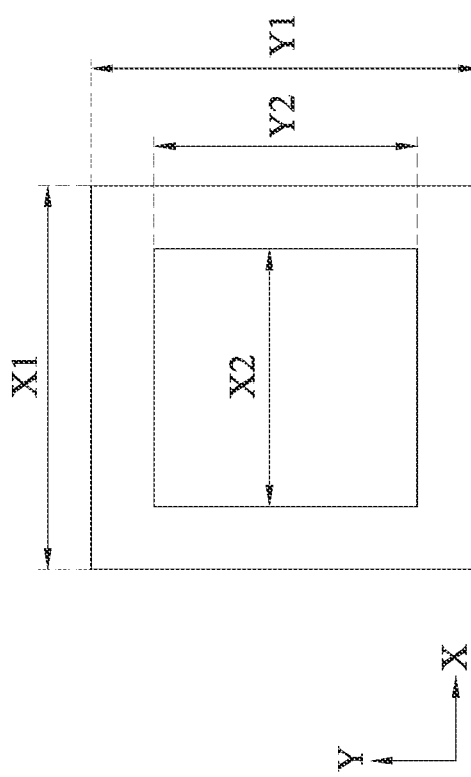
FIG. 1A
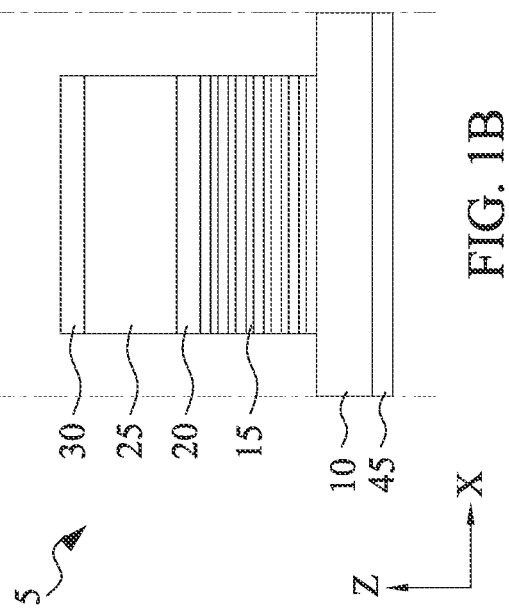
FIG. 1B
FIG. 1C

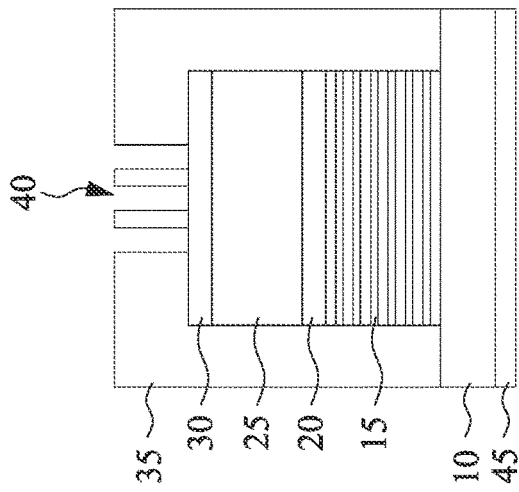
FIG. 2A
FIG. 2B
FIG. 2C
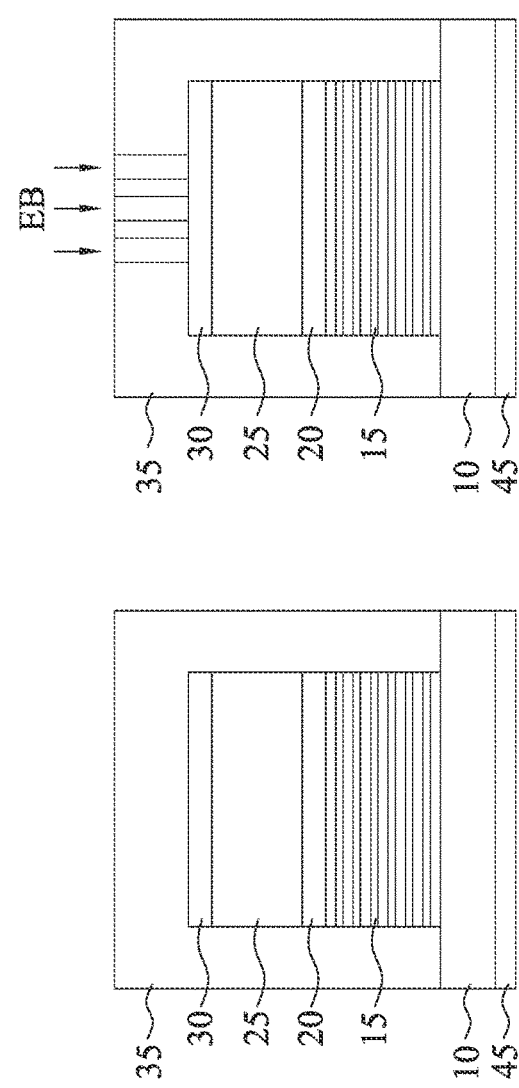
FIG. 2D
FIG. 2E
FIG. 2F

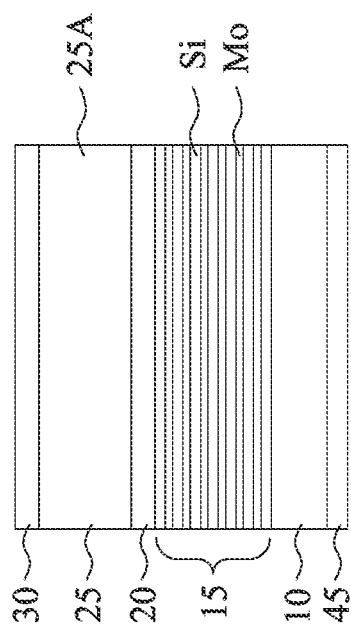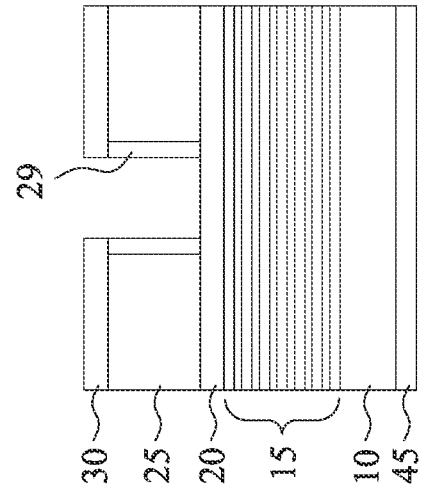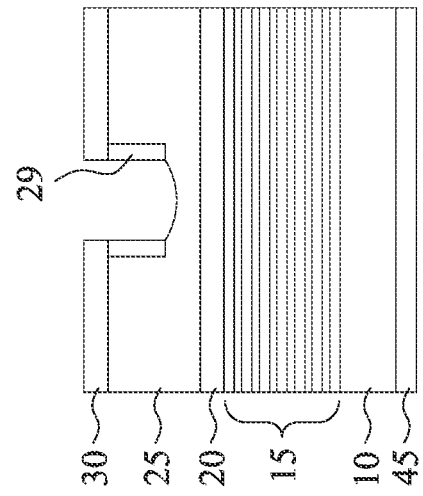

EUV PHOTO MASKS AND MANUFACTURING METHOD THEREOF

RELATED APPLICATIONS

This application is a continuation of U.S. patent application Ser. No. 17/103,023 filed Nov. 24, 2020, now U.S. Pat. No. 11,592,737, which claims priority to U.S. Provisional Patent Application No. 63/032,444 filed May 29, 2020, the entire contents of each of which are incorporated herein by reference.

BACKGROUND

Photolithography operations are one of the key operations in the semiconductor manufacturing process. Photolithography techniques include ultraviolet lithography, deep ultraviolet lithography, and extreme ultraviolet lithography (EUVL). The photo mask is an important component in photolithography operations. It is critical to fabricate EUV photo masks having a high contrast with a high reflectivity part and a high absorption part.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A, 1B and 1C show EUV photo mask blanks according to embodiments of the present disclosure.

FIGS. 2A, 2B, 2C, 2D, 2E and 2F schematically illustrate a method of fabricating an EUV photo mask according to an embodiment of the present disclosure.

FIGS. 4A, 4B and 4C show cross sectional views of various states of manufacturing an EUV photo mask according to embodiments of the present disclosure.

DETAILED DESCRIPTION

Figure 3A:
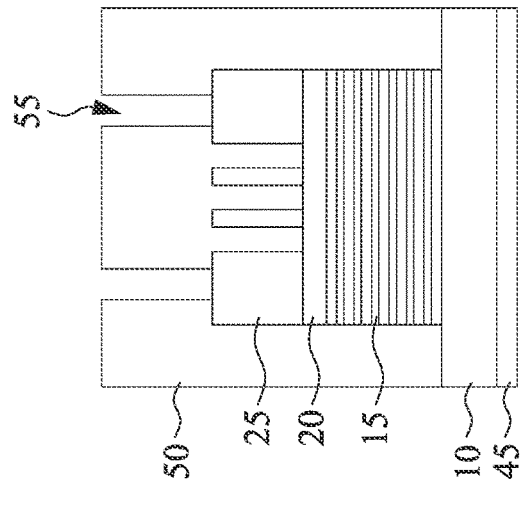
FIGS. 3A, 3B, 3C and 3D schematically illustrate a method of fabricating an EUV photo mask according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

Embodiments of the present disclosure provide a method of manufacturing an EUV photo mask. More specifically, the present disclosure provides techniques to prevent or suppress damage on a backside conductive layer of an EUV photo mask.

EUV lithography (EUVL) employs scanners using light having a wavelength in the extreme ultraviolet (EUV) region (about 1 nm to about 100 nm, for example, 13.5 nm). The mask is a critical component of an EUVL system. Because the optical materials are not transparent to EUV radiation, EUV photo masks are reflective masks. Circuit patterns are formed in an absorber layer disposed over the reflective structure. The absorber has a low EUV reflectivity, for example, less than 3-5%.

The present disclosure provides an EUV reflective photo mask having a low reflective (high absorbing) absorber structure.

FIGS. 1A and 1B show an EUV reflective photo mask blank according to an embodiment of the present disclosure. FIG. 1A is a plan view (viewed from the top) and FIG. 1B is a cross sectional view along the X direction.

In some embodiments, the EUV photo mask with circuit patterns is formed from a EUV photo mask blank 5. The EUV photo mask blank 5 includes a substrate 10, a multi-layer Mo/Si stack 15 of multiple alternating layers of silicon and molybdenum, a capping layer 20, an absorber layer 25 and a hard mask layer 30. Further, a backside conductive layer 45 is formed on the backside of the substrate 10, as shown in FIG. 1B.

The substrate 10 is formed of a low thermal expansion material in some embodiments. In some embodiments, the substrate is a low thermal expansion glass or quartz, such as fused silica or fused quartz. In some embodiments, the low thermal expansion glass substrate transmits light at visible wavelengths, a portion of the infrared wavelengths near the visible spectrum (near infrared), and a portion of the ultraviolet wavelengths. In some embodiments, the low thermal expansion glass substrate absorbs extreme ultraviolet wavelengths and deep ultraviolet wavelengths near the extreme ultraviolet. In some embodiments, the size of the substrate 10 is 152 mm×152 mm having a thickness of about 20 mm. In other embodiments, the size of the substrate 10 is smaller than 152 mm×152 mm and equal to or greater than 148 mm×148 mm. The shape of the substrate 10 is square or rectangular.

In some embodiments, the functional layers above the substrate (the multilayer Mo/Si stack 15, the capping layer 20, the absorber layer 25 and the hard mask layer 30) have a smaller width than the substrate 10. In some embodiments, the size of the functional layers is in a range from about 138 mm×138 mm to 142 mm×142 mm. The shape of the functional layers is square or rectangular.

In other embodiments, the absorber layer 25 and the hard mask layer 30 have a smaller size in the range from about 138 mm×138 mm to 142 mm×142 mm than the substrate 10, the multilayer Mo/Si stack 15 and the capping layer 20 as shown in FIG. 1C. The smaller size of one or more of the functional layers can be formed by using a frame shaped cover having an opening in a range from about 138 mm×138 mm to 142 mm×142 mm, when forming the respective layers by, for example, sputtering. In other embodiments, all of the layers above the substrate 10 have the same size as the substrate 10.

In some embodiments, the Mo/Si multilayer stack 15 includes from about 30 alternating layers each of silicon and molybdenum to about 60 alternating layers each of silicon and molybdenum. In certain embodiments, from about 40 to about 50 alternating layers each of silicon and molybdenum are formed. In some embodiments, the reflectivity is higher than about 70% for wavelengths of interest e.g., 13.5 nm. In some embodiments, the silicon and molybdenum layers are formed by chemical vapor deposition (CVD), plasma-enhanced CVD (PECVD), atomic layer deposition (ALD), physical vapor deposition (PVD) (sputtering), or any other suitable film forming method. Each layer of silicon and molybdenum is about 2 nm to about 10 nm thick. In some embodiments, the layers of silicon and molybdenum are about the same thickness. In other embodiments, the layers of silicon and molybdenum are different thicknesses. In some embodiments, the thickness of each silicon layer is about 4 nm and the thickness of each molybdenum layer is about 3 nm.

In other embodiments, the multilayer stack 15 includes alternating molybdenum layers and beryllium layers. In some embodiments, the number of layers in the multilayer stack 15 is in a range from about 20 to about 100 although any number of layers is allowed as long as sufficient reflectivity is maintained for imaging the target substrate. In some embodiments, the reflectivity is higher than about 70% for wavelengths of interest e.g., 13.5 nm. In some embodiments, the multilayer stack 15 includes about 30 to about 60 alternating layers of Mo and Be. In other embodiments of the present disclosure, the multilayer stack 15 includes about 40 to about 50 alternating layers each of Mo and Be.

The capping layer 20 is disposed over the Mo/Si multilayer stack 15 to prevent oxidation of the multilayer stack 15 in some embodiments. In some embodiments, the capping layer 20 is made of ruthenium, a ruthenium alloy (e.g., RuNb, RuZr, RuZrN, RuRh, RuNbN, RuRhN, RuV or RuVN) or a ruthenium based oxide (e.g., $RuO_2$, RuNbO, RiVO or RuON), having a thickness of from about 2 nm to about 10 nm. In certain embodiments, the thickness of the capping layer 20 is from about 2 nm to about 5 nm. In some embodiments, the capping layer 20 has a thickness of 3.5 nm±10%. In some embodiments, the capping layer 20 is formed by chemical vapor deposition, plasma-enhanced chemical vapor deposition, atomic layer deposition, physical vapor deposition (e.g., sputtering), or any other suitable film forming method. In other embodiments, a Si layer is used as the capping layer 20.

The absorber layer 25 is disposed over the capping layer 20. In some embodiments, the absorber layer 25 is Ta-based material. In some embodiments, the absorber layer 25 is made of TaN, TaO, TaB, TaBO or TaBN having a thickness from about 25 nm to about 100 nm. In certain embodiments, the absorber layer 25 thickness ranges from about 50 nm to about 75 nm. In other embodiments, the absorber layer 25 includes a Cr-based material, such as CrN, CrO, CrON, CrB and/or CrBN. In some embodiments, the absorber layer 25 has a multilayered structure of Cr, CrO, CrON, CrB and/or CrBN. In other embodiments, the absorber layer 25 includes an Ir-based material including elemental iridium (not compound) or an iridium alloy, such as IrPt, IrAl, IrRu, IrB, IrN, IrSi and/or IrTi. In other embodiments, the absorber layer 25 includes a Pt-based material including elemental platinum (not compound) or a Pt alloy, such as PtAl, PtRu, PtB, PtSi, PtN and/or PtTi. In other embodiments, the absorber layer 25 includes a Co-based material including elemental cobalt (not compound) or a Co alloy, such as CoO, CoB, CoBN, CoN and/or CoSi.

In some embodiments, the absorber layer 25 is formed by chemical vapor deposition, plasma-enhanced chemical vapor deposition, atomic layer deposition, physical vapor deposition, or any other suitable film forming method. One or more layers are disposed between the capping layer 20 and the absorber layer 25 as set forth below in some embodiments.

In some embodiments, the absorber layer 25 further includes one or more elements, such as Si, B, Ge, Al, As, Sb, Te, Se and/or Bi, as set forth below.

In some embodiments, an antireflective layer (not shown) is optionally disposed over the absorber layer 25. The antireflective layer is made of a silicon oxide in some embodiments, and has a thickness of from about 2 nm to about 10 nm. In other embodiments, a TaBO or $Ta_2O_5$ layer having a thickness in a range from about 2 nm to about 20 nm is used as the antireflective layer. In some embodiments, the thickness of the antireflective layer is from about 3 nm to about 10 nm. In some embodiments, the antireflective layer is formed by chemical vapor deposition, plasma-enhanced chemical vapor deposition, atomic layer deposition, physical vapor deposition, or any other suitable film forming method.

The hard mask layer 30 is disposed over the absorbing layer 25 in some embodiments. The hard mask layer 30 is formed over the antireflective layer in some embodiments. In some embodiments, the hard mask layer 30 is made of a Cr based material, such as CrN, CrO, CrON or CrCON. In other embodiments, the hard mask layer 30 is made of a Ta based material, such as TaB, TaO, TaBO or TaBN. In other embodiments, the hard mask layer 30 is made of silicon, a silicon-based compound (e.g., SiN or SiON), ruthenium or a ruthenium-based compound (Ru or RuB). The hard mask layer 30 has a thickness of about 4 nm to about 20 nm in some embodiments. The material of the hard mask layer 30 is selected to have a sufficiently high etching selectivity against the absorber layer 25 and the same or similar etching rate as the capping layer 20. In some embodiments, the hard mask layer 30 is formed by chemical vapor deposition, plasma-enhanced chemical vapor deposition, atomic layer deposition, physical vapor deposition, or any other suitable film forming method.

In some embodiments, the backside conductive layer 45 is disposed on a second main surface of the substrate 10 opposing the first main surface of the substrate 10 on which the Mo/Si multilayer stack 15 is formed. In some embodiments, the backside conductive layer 45 is made of TaB (tantalum boride) or other Ta-based conductive material. In some embodiments, the tantalum boride is crystal. The crystalline tantalum boride includes TaB, $Ta_5B_6$, $Ta_3B_4$ and $TaB_2$. In other embodiments, the tantalum boride is poly crystalline or amorphous. In other embodiments, the backside conductive layer 45 is made of a Cr-based conductive material (CrN or CrON). In some embodiments, sheet resistance of the backside conductive layer 45 is equal to or smaller than 20Ω/□. In certain embodiments, the sheet resistance of the backside conductive layer 45 is equal to or more than 0.1Ω/□. In some embodiments, surface roughness Ra of the backside conductive layer 45 is equal to or smaller than 0.25 nm. In certain embodiments, the surface roughness Ra of the backside conductive layer 45 is equal to or more than 0.05 nm. Further, in some embodiments, the flatness of the backside conductive layer 45 is equal to or less than 50 nm (within the EUV photo mask). In some embodiments, the flatness of the backside conductive layer 45 is more than 1 nm. A thickness of the backside conductive layer 45 is in a range from about 50 nm to about 400 nm in some embodiments. In other embodiments, the backside conductive layer 45 has a thickness of about 50 nm to about 100 nm. In certain embodiments, the thickness is in a range from about 65 nm to about 75 nm. In some embodiments, the backside conductive layer 45 is formed by atmospheric chemical vapor deposition (CVD), low pressure CVD, plasma-enhanced CVD, laser-enhanced CVD, atomic layer deposition (ALD), molecular beam epitaxy (MBE), physical vapor deposition including thermal deposition, pulsed laser deposition, electron-beam evaporation, ion beam assisted evaporation and sputtering, or any other suitable film forming method. In cases of CVD, source gases include $TaCl_5$ and $BCl_3$ in some embodiments.

In some embodiments, a photo catalytic layer (not shown) that can catalyze hydrocarbon residues formed on the photo mask into $CO_2$ and/or $H_2O$ with EUV radiation is disposed on the capping layer 20. Thus, an in-situ self-cleaning of the mask surface is performed. In some embodiments, in the EUV scanner system, oxygen and hydrogen gases are injected into the EUV chamber to maintain the chamber pressure (e.g., at about 2 Pa). The chamber background gas can be a source of oxygen. In addition to the photo catalytic function, the photo catalytic layer has sufficient durability and resistance to various chemicals and various chemical processes, such as cleaning and etching. In some examples, ozonated water used to make the EUV reflective mask in subsequent processes damages the capping layer 20 made of Ru and results in a significant EUV reflectivity drop. In some embodiments, after Ru oxidation, Ru oxide is easily etched away by an etchant, such as $Cl_2$ or $CF_4$ gas. In some embodiments, the photo catalytic layer includes one or more of titanium oxide ($TiO_2$), tin oxide (SnO), zinc oxide (ZnO) and cadmium sulfide (CdS). The thickness of the photo catalytic layer is in a range from about 2 nm to about 10 nm in some embodiments, and is in a range from about 3 nm to about 7 nm in other embodiments. When the thickness is too thin, the photo catalytic layer may not sufficiently function as an etch stop layer. When the thickness is too large, the photo catalytic layer may absorb the EUV radiation.

FIGS. 2A-2F and 3A-3D schematically illustrate a method of fabricating an EUV photo mask for use in extreme ultraviolet lithography (EUVL). It is understood that additional operations can be provided before, during, and after processes shown by FIGS. 2A-3D, and some of the operations described below can be replaced or eliminated for additional embodiments of the method. The order of the operations/processes may be interchangeable.

In the fabrication of an EUV photo mask, a first photoresist layer 35 is formed over the hard mask layer 30 of the EUV photo mask blank as shown in FIG. 2A, and the photoresist layer 35 is selectively exposed to actinic radiation EB as shown in FIG. 2B. Before the first photoresist layer 35 is formed, the EUV photo mask blank is subject to inspection in some embodiments. The selectively exposed first photoresist layer 35 is developed to form a pattern 40 in the first photoresist layer 35 as shown in FIG. 2C. In some embodiments, the actinic radiation EB is an electron beam or an ion beam. In some embodiments, the pattern 40 corresponds to a pattern of semiconductor device features for which the EUV photo mask will be used to form in subsequent operations.

Next, the pattern 40 in the first photoresist layer 35 is extended into the hard mask layer 30 forming a pattern 41 in the hard mask layer 30 exposing portions of the absorber layer 25, as shown in FIG. 2D. The pattern 41 extended into the hard mask layer 30 is formed by etching, in some embodiments, using a suitable wet or dry etchant that is selective to the absorber layer 25. After the pattern 41 in the hard mask layer 30 is formed, the first photoresist layer 35 is removed by a photoresist stripper to expose the upper surface of the hard mask layer 30, as shown in FIG. 2E.

Then, the pattern 41 in the hard mask layer 30 is extended into the absorber layer 25 forming a pattern 42 in the absorber layer 25 exposing portions of the capping layer 20, as shown in FIG. 2F, and then the hard mask layer 30 is removed as shown in FIG. 3A. The pattern 42 extended into the absorber layer 25 is formed by etching, in some embodiments, using a suitable wet or dry etchant that is selective to the absorber layer 25. In some embodiments, plasma dry etching is used.

Figure 3B:
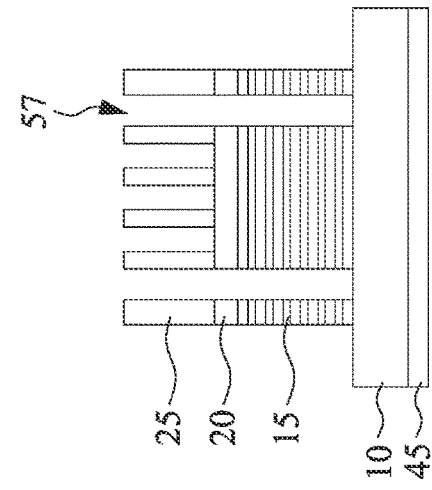

As shown in FIG. 3B, a second photoresist layer 50 is formed over the absorber layer 25 filling the pattern 42 in the absorber layer 25. The second photoresist layer 50 is selectively exposed to actinic radiation such as electron beam, ion beam or UV radiation. The selectively exposed second photoresist layer 50 is developed to form a pattern 55 in the second photoresist layer 50 as shown in FIG. 3B. The pattern 55 corresponds to a black border surrounding the circuit patterns. A black border is a frame shape area created by removing all the multilayers on the EUV photo mask in the region around a circuit pattern area. It is created to prevent exposure of adjacent fields when printing an EUV photo mask on a wafer. The width of the black border is in a range from about 1 mm to about 5 mm in some embodiments.

Figure 3C:
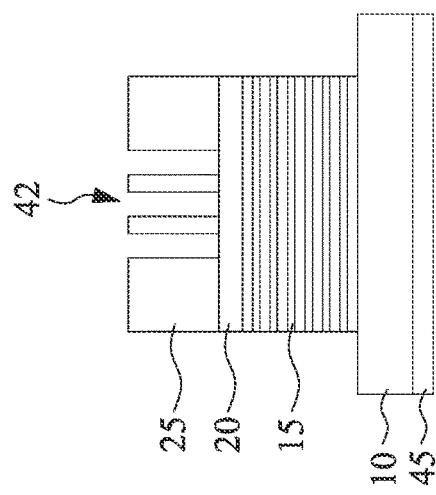

Next, the pattern 55 in the second photoresist layer 50 is extended into the absorber layer 25, capping layer 20, and Mo/Si multilayer stack 15 forming a pattern 57 (see, FIG. 3D) in the absorber layer 25, capping layer 20, and Mo/Si multilayer stack 15 exposing portions of the substrate 10, as shown in FIG. 3C. The pattern 57 is formed by etching, in some embodiments, using one or more suitable wet or dry etchants that are selective to each of the layers that are etched. In some embodiments, plasma dry etching is used.

Figure 3D:
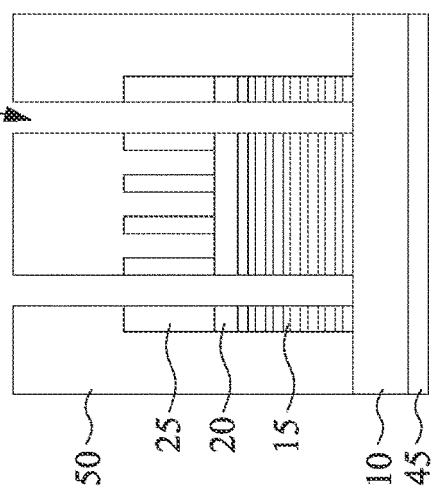

Then, the second photoresist layer 50 is removed by a suitable photoresist stripper to expose the upper surface of the absorber layer 25 as shown in FIG. 3D. The black border pattern 57 in the absorber layer 25, capping layer 20, and the Mo/Si multilayer stack 15 defines a black border of the photo mask in some embodiments of the disclosure.

Generally, a Cr-based material, an Ir-based material, a Pt-based material, or a Co-based material (materials other than a Ta-based material) have a high EUV absorption (extinction) coefficient k. For example, CrN has a k-value of 0.0387, which is higher than the k value (0.031) of TaBN and the k value (0.027) of TaBO. Accordingly, it is possible to reduce the thickness of the absorber layer (e.g., from 70 nm of TaBN to 46 nm of CrN), which can suppress three-dimensional effects of the patterned absorber layer. However, a Cr-based material, an Ir-based material, a Pt-based material, or a Co-based material are difficult to etch because of their low etching rates, and it is difficult to control the shape of the patterned absorber layer. For example, the side face of the patterned absorber layer may have a concave shape or tapered shape, which causes three-dimensional effects.

In embodiments of the present disclosure, one or more elements are added to the absorber layer to control the profile of the patterned absorber layer 25. In particular, the element is selected such that a protective (or passivation) layer is formed on side faces of the patterned or etched absorber layer as a result of a reaction between the element and an etching gas. In some embodiments, the protective layer is an oxide.

In some embodiments, the absorber layer 25 further includes one or more additional metalloid elements, such as Si, B, Ge, Al, As, Sb, Te, Se and/or Bi. In some embodiments, the additional element is different from the elements constituting the absorber layer 25 as the base material.

In some embodiments, the additional element 25A is doped in the absorber layer 25 as shown in FIG. 4A. In some embodiments, the concentration of the doped additional element is in a range from about $1 \times 10^{20}$ atoms/cm$^3$ to $1 \times 10^{22}$ atoms/cm$^3$ and is in a range from about $5 \times 10^{20}$ atoms/cm$^3$ to $5 \times 10^{21}$ atoms/cm$^3$ in other embodiments. In some embodiments, the additional elements 25A are uniformly distributed in the absorber layer 25. In other embodiments, the distribution of the additional element is not uniform in the absorber layer. In some embodiments, the concentration of the additional element increases from the bottom (interface between the capping layer 20 and the absorber layer) to the top (interface between the absorber layer 25 and the hard mask layer 30). In other embodiments, the concentration of the additional element decreases from the bottom to the top. In other embodiments, the concentration of the additional element increases and then decrease from the bottom to the top, and in other embodiments, the concentration of the additional element decreases and then increases from the bottom to the top. In some embodiments, the concentration of the additional element is substantially uniform in the lateral direction (within ±5%). In some embodiments, a concentration of the additional elements 25A is in a range from 0.5 atomic % to 30 atomic % and in in a range from about 1 atomic % to 10 atomic % in other embodiments in an EUV mask. When the amount of the additional elements is smaller than these ranges, the protective effect as explained below may not be obtained, and when the amount of the additional elements is greater than these ranges, it may decrease absorption of EUV light by the absorber layer 25 or may make it difficult to etch the absorber layer 25.

In some embodiments, the absorber layer 25 doped with the additional elements 25A is formed by CVD, ALD, or PVD including sputtering. In some embodiments, a sputtering process uses a sputtering target made of the material for the absorber layer (e.g., TaBN) and additional element (e.g., Si). The sputtering target for the absorber layer may be disposed beside the sputtering target for the additional elements, and by sputtering both targets by an ion or an electron beam, the absorber layer doped with the additional elements is formed. By adjusting the ion or electron beam, it is possible to adjust the concentration of the additional elements. In some embodiments, the targets are sputtered by respective ion or electron beams. In the case of CVD or ALD, an in-situ doping technique is employed in some embodiments.

As shown in FIGS. 4B and 4C, during the etching of the absorber layer 25, a protective layer 29 is formed on etched side faces of the absorber layer, to suppress lateral etching of the absorber layer. In some embodiments, an etching gas includes a chlorine containing gas (e.g., $Cl_2$, HCl, $CCl_4$, etc.) and an oxygen containing gas (e.g., $O_2$). In some embodiments, a fluorine containing gas (e.g., $F_2$, $SF_6$, fluorocarbon ($CF_4$, $CHF_3$, etc.), etc.) is used. In some embodiments, oxygen in the etching gas reacts with the additional element 25A forming the protective layer 29 as byproduct of the etching. In some embodiments, the protective layer is an oxide of the additional elements 25A, such as silicon oxide, germanium oxide, boron oxide, etc. In some embodiments, the average thickness of the protective layer 29 is in a range from about 0.2 nm to about 2 nm. In other embodiments, a polymer containing carbon, fluorine, and/or hydrogen is formed as the protective layer 29.

As shown in FIGS. 4B and 4C, since the protective layer 29 is formed on the etched side face of the absorber layer during the patterning of the absorber layer 25, it is possible to improve the profile of the patterned absorber layer. In some embodiments, a substantially vertical sidewall is obtained. In particular, an undercut of the absorber layer 25 under the hard mask layer 30, which would be otherwise formed during an over etching step of the etching process, can be avoided.

Figure 5A:
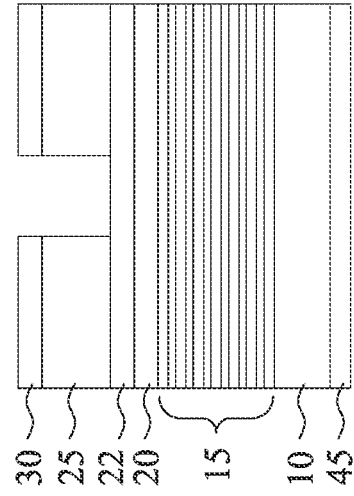
FIGS. 5A, 5B, 5C and 5D show cross sectional views of various states of manufacturing an EUV photo mask according to embodiments of the present disclosure.

In other embodiments, the additional element is provided in the mask blank as a layer 22 disposed between the capping layer 20 and the absorber layer 25, as shown in FIGS. 5A-5D. As shown in FIG. 5A, an intermediate layer 22 as a source of the additional element is formed between the capping layer 20 and the absorber layer 25. In some embodiments, the intermediate layer 22 is made of one of Si, B, Ge, Al, As, Sb, Te, Se and/or Bi (not compound) or an alloy or compound thereof. In some embodiments, the thickness of the intermediate layer 22 is in a range from about 1 nm to about 10 nm, and is in a range from about 2 nm to about 5 nm in other embodiments. If the thickness is too small, a supply of the additional element to form a protective layer is insufficient, and if the thickness is too large, it would affect reflectivity and/or absorption of the EUV mask. In some embodiments, the intermediate layer is formed by CVD, PECVD, ALD, PVD (sputtering), or any other suitable film forming method. In some embodiments, the absorber layer 25 does not contain the element of the intermediate layer 22.

Figure 5B:
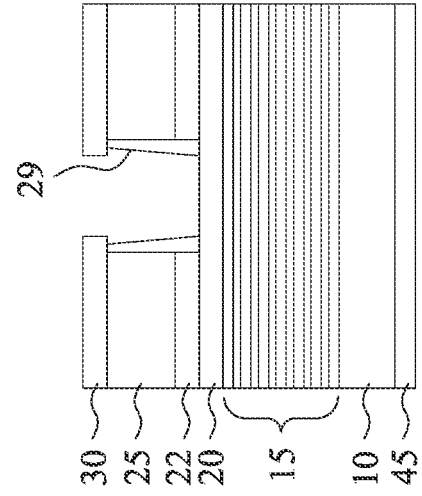
Figure 5C:
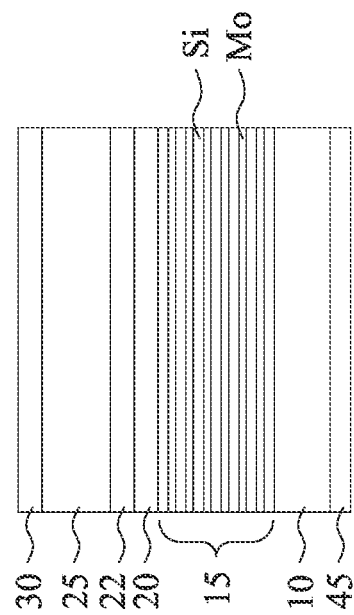
Figure 5D:
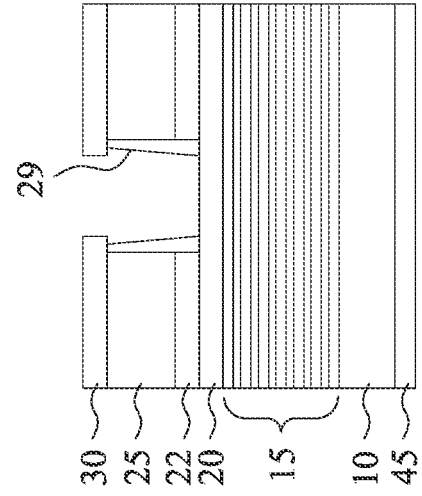

As shown in FIG. 5B, the etching of the absorber layer 25 reaches the intermediate layer 22. Then, during the over etching step, the intermediate layer is etched forming a protective layer 29 as shown in FIG. 5C. Accordingly, undercut or convex sidewall shapes, which would be otherwise formed during the over etching step, are suppressed. In some embodiments, the thickness of the protective layer 29 along the vertical direction is not uniform. In some embodiments, the thickness increases from the bottom to the top as shown in FIG. 5D. In some embodiments, intermediate layer 22 is formed within the absorber layer 25 such that the intermediate layer 22 is disposed between a lower absorber layer and an upper absorber layer. In such a case, the thickness of the lower absorber layer is the same as or different (smaller/larger) than the thickness of the upper absorber layer.

Figure 6A:
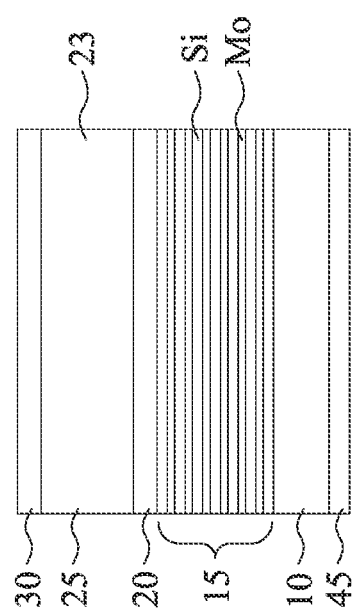
FIGS. 6A and 6B show cross sectional views of various states of manufacturing an EUV photo mask according to embodiments of the present disclosure.
Figure 6B:
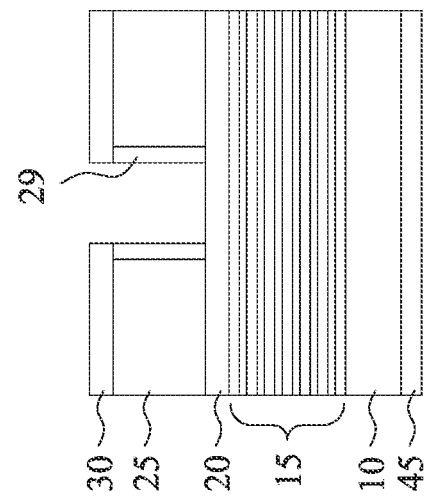

In some embodiments, multiple intermediate layers 23 are formed in the absorber layer 25 as shown in FIG. 6A. In some embodiments, each of the intermediate layers 23 is made of one of Si, B, Ge, Al, As, Sb, Te, Se and/or Bi (not compound) or an alloy thereof. In some embodiments, 2 to 10 layers made of the additional element, as set forth above, are within the absorber layer. In some embodiments, all of the intermediate layers 23 are made of the same material and in other embodiments, at least one of the intermediate layers 23 is made of a different material than the remaining layers. In some embodiments, one layer is formed at the bottom of the absorber layer similar to FIG. 5A or one layer is formed at the top of the absorber layer. In some embodiments, the thickness of the each of the intermediate layers 23 is in a range from about 0.1 nm to about 1 nm, and is in a range from about 0.2 nm to about 0.5 nm in other embodiments. If the thickness is too small, a supply of the additional element to form a protective layer is insufficient, and if the thickness is too large, it would affect the absorption capability of the absorber layer 25. In some embodiments, at least one of the intermediate layers 23 is a mono layer or bi-layer of the additional element. In some embodiments, the thicknesses of the intermediate layer 23 are the same each other, and in other embodiments, at least one of the intermediate layers 23 has a different thickness than the remaining layers. In some embodiments, the intermediate layers 23 are arranged in equal intervals along the vertical direction. In other embodiments, the pitch of the intermediate layers 23 varies.

In some embodiments, the intermediate layer 22 or intermediate layer 23 are formed by sputtering using a sputtering target made of the additional element (e.g., Si). The sputtering target may be disposed beside another sputtering target, for example, a target for the absorber layer. By switching the targets, it is possible to form a bi-layer or multilayer structure of the intermediate layer and the absorber layer. The switching may include switching an ion or electron beam of the sputtering process onto the targets.

In some embodiments, the protective layer 29 remains on the finished photo mask. In other embodiments, the protective layer 29 is removed by, for example, wet and/or dry etching, after the absorber layer 25 is patterned, and thus no protective layer remains on the finished photo mask.

Figure 7A:
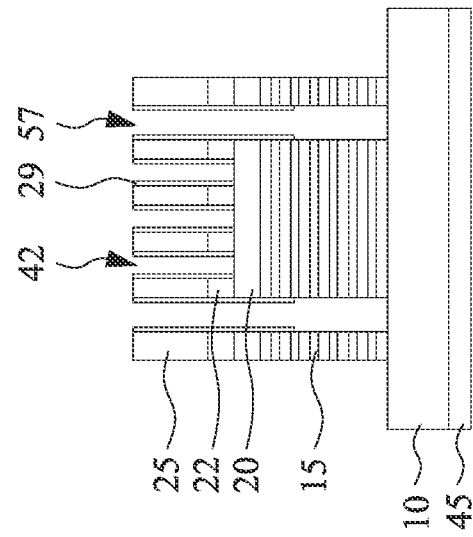
FIGS. 7A and 7B show cross sectional views of EUV photo masks according to embodiments of the present disclosure.

FIG. 7A shows a cross sectional view of a finished EUV photo mask according to embodiments of the present disclosure. In some embodiments, the EUV photo mask with circuit patterns 42 as shown in FIG. 7A includes a substrate 10, a multilayer Mo/Si stack 15 of multiple alternating layers of silicon and molybdenum, a capping layer 20, and a patterned absorber layer 25. Further, a black border pattern 57 is formed in the absorber layer 25, the capping layer 20 and the multilayer stack 15, and a backside conductive layer 45 is formed on the backside of the substrate 10. In some embodiments, the patterned absorber layer 25 includes a Cr-based material, a Pt-based material, an Ir-based material, or a Co-based material. In some embodiments, the absorber layer 25 further contains one or more of Si, B, Ge, Al, As, Sb, Te, Se and/or Bi. In some embodiments, a protective layer 29 (e.g., oxide of one or more of Si, B, Ge, Al, As, Sb, Te, Se and/or Bi) is formed on the sidewalls of the patterned absorber layer 25. In some embodiments, the protective layer is formed on sidewalls of the capping layer and/or the multilayer stack 15 in the black border pattern 57. In some embodiments, no protective layer remains on the finished photo mask.

Figure 7B:
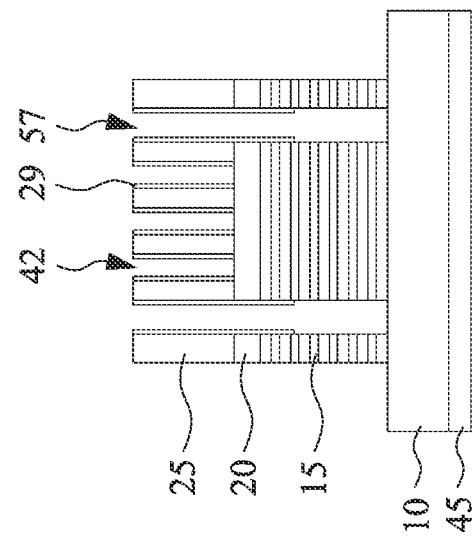

FIG. 7B shows a cross sectional view of a finished EUV photo mask according to embodiments of the present disclosure. In some embodiments, the EUV photo mask with circuit patterns 42 as shown in FIG. 7B includes a substrate 10, a multilayer Mo/Si stack 15 of multiple alternating layers of silicon and molybdenum, a capping layer 20, a patterned intermediate layer 22, and a patterned absorber layer 25. Further, a black border pattern 57 is formed in the absorber layer 25, the intermediate layer 22, the capping layer 20 and the multilayer stack 15, and a backside conductive layer 45 is formed on the backside of the substrate 10.

In some embodiments, the patterned absorber layer 25 includes a Cr-based material, a Pt-based material, an Ir-based material, or a Co-based material. In some embodiments, the intermediate layer 22 includes one or more of Si, B, Ge, Al, As, Sb, Te, Se and/or Bi or an alloy thereof. In some embodiments, a protective layer 29 (e.g., oxide of one or more of Si, B, Ge, Al, As, Sb, Te, Se and/or Bi) is formed on the sidewalls of the patterned absorber layer 25. In some embodiments, the protective layer is formed on sidewalls of the capping layer and/or the multilayer stack 15 in the black border pattern 57. In some embodiments, no protective layer remains on the finished photo mask FIG. 8A shows a flowchart of a method of making a semiconductor device, and FIGS. 8B, 8C, 8D and 8E show a sequential manufacturing operation of the method of making a semiconductor device in accordance with embodiments of present disclosure. A semiconductor substrate or other suitable substrate to be patterned to form an integrated circuit thereon is provided. In some embodiments, the semiconductor substrate includes silicon. Alternatively or additionally, the semiconductor substrate includes germanium, silicon germanium or other suitable semiconductor material, such as a Group III-V semiconductor material. At S801 of FIG. 8A, a target layer to be patterned is formed over the semiconductor substrate. In certain embodiments, the target layer is the semiconductor substrate. In some embodiments, the target layer includes a conductive layer, such as a metallic layer or a polysilicon layer, a dielectric layer, such as silicon oxide, silicon nitride, SiON, SiOC, SiOCN, SiCN, hafnium oxide, or aluminum oxide, or a semiconductor layer, such as an epitaxially formed semiconductor layer. In some embodiments, the target layer is formed over an underlying structure, such as isolation structures, transistors or wirings. At S802, of FIG. 8A, a photo resist layer is formed over the target layer, as shown in FIG. 8B. The photo resist layer is sensitive to the radiation from the exposing source during a subsequent photolithography exposing process. In the present embodiment, the photo resist layer is sensitive to EUV light used in the photolithography exposing process. The photo resist layer may be formed over the target layer by spin-on coating or other suitable technique. The coated photo resist layer may be further baked to drive out solvent in the photo resist layer. At S803 of FIG. 8A, the photoresist layer is patterned using an EUV reflective mask as set forth above, as shown in FIG. 8B. The patterning of the photoresist layer includes performing a photolithography exposing process by an EUV exposing system using the EUV mask. During the exposing process, the integrated circuit (IC) design pattern defined on the EUV mask is imaged to the photoresist layer to form a latent pattern thereon. The patterning of the photoresist layer further includes developing the exposed photoresist layer to form a patterned photoresist layer having one or more openings. In one embodiment where the photoresist layer is a positive tone photoresist layer, the exposed portions of the photoresist layer are removed during the developing process. The patterning of the photoresist layer may further include other process steps, such as various baking steps at different stages. For example, a post-exposure-baking (PEB) process may be implemented after the photolithography exposing process and before the developing process.

Figure 8C:
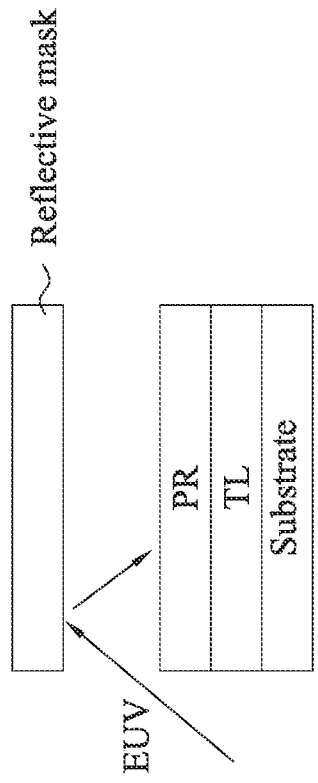
FIGS. 8B, 8C, 8D and 8E show a sequential manufacturing operation of a method of making a semiconductor device in accordance with embodiments of present disclosure.
Figure 8D:
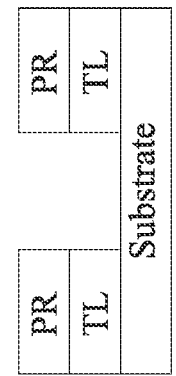
Figure 8E:
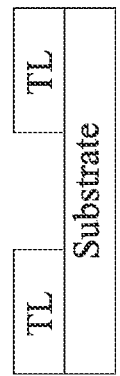
Figure 8A:
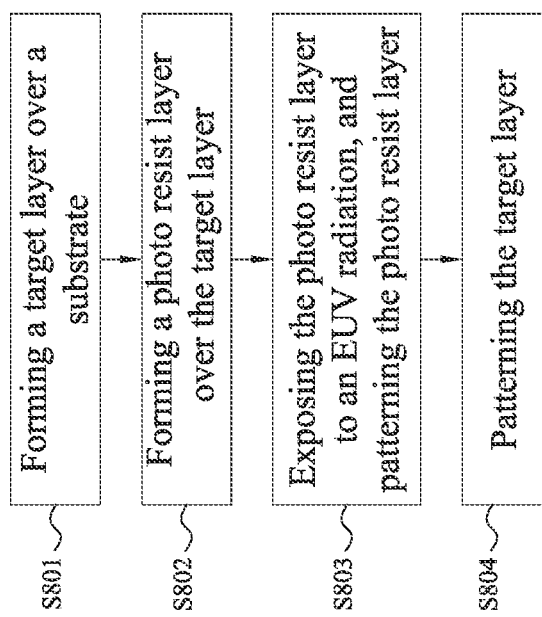
FIG. 8A shows a flowchart of a method making a semiconductor device.
Figure 8B:
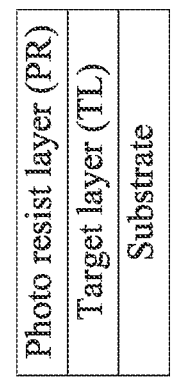

At S804 of FIG. 8A, the target layer is patterned utilizing the patterned photoresist layer as an etching mask, as shown in FIG. 8D. In some embodiments, the patterning the target layer includes applying an etching process to the target layer using the patterned photoresist layer as an etch mask. The portions of the target layer exposed within the openings of the patterned photoresist layer are etched while the remaining portions are protected from etching. Further, the patterned photoresist layer may be removed by wet stripping or plasma ashing, as shown in FIG. 8E.

In the present disclosure, one or more additional elements are included in or adjacent to the absorber layer that can form a protective layer during the etching of the absorber layer, to control profile of the patterned absorber layer. It is also possible to suppress or prevent an undercut (lateral recess) under the hard mask layer. The additional elements are effective for an absorber layer that generally has a low etching rate. It is possible to obtain a vertical sidewall of the patterned absorber layer, which in turn suppresses the three-dimensional effect in the EUV lithography.

It will be understood that not all advantages have been necessarily discussed herein, no particular advantage is required for all embodiments or examples, and other embodiments or examples may offer different advantages.

According to one aspect of the present application, a reflective mask includes a substrate, a reflective multilayer disposed on the substrate, a capping layer disposed on the reflective multilayer, and an absorber layer disposed on the capping layer. The absorber layer includes a base material made of one or more of a Cr based material, an Ir based material, a Pt based material, or Co based material, and further contains one or more additional elements selected from the group consisting of Si, B, Ge, Al, As, Sb, Te, Se and Bi. In one or more of the foregoing and following embodiments, the one or more additional elements are not included in the base material. In one or more of the foregoing and following embodiments, a concentration of the one or more additional elements is in a range from 0.5 atomic % to 30 atomic %. In one or more of the foregoing and following embodiments, a concentration of the one or more additional elements in the absorber layer along vertical direction is not uniform. In one or more of the foregoing and following embodiments, the based material of the absorber layer is made of an Ir based material, a Pt based material, or Co based material. In one or more of the foregoing and following embodiments, the absorber layer is patterned, and the reflective mask further comprises a protective layer disposed on sidewalls of the patterned absorber layer. In one or more of the foregoing and following embodiments, the protective layer includes oxide of the one or more additional elements.

In accordance with another aspect of the present disclosure, a reflective mask includes a substrate, a reflective multilayer disposed on the substrate, a capping layer disposed on the reflective multilayer, an intermediate layer disposed on the capping layer, and an absorber layer disposed on the intermediate layer. The intermediate layer is a layer of one or more metalloid elements. In one or more of the foregoing and following embodiments, the absorber layer includes one or more of a Cr based material, an Jr based material, a Pt based material, or Co based material. In one or more of the foregoing and following embodiments, a thickness of the intermediate layer is in a range from 1 nm to 10 nm. In one or more of the foregoing and following embodiments, the absorber layer is patterned, and the reflective mask further comprises a protective layer disposed on sidewalls of the patterned absorber layer. In one or more of the foregoing and following embodiments, the protective layer includes a compound of the one or more metalloid elements. In one or more of the foregoing and following embodiments, the protective layer includes silicon oxide or boron oxide. In one or more of the foregoing and following embodiments, the absorber layer does not contains an element of the intermediate layer.

In accordance with another aspect of the present disclosure, a reflective mask includes a substrate, a reflective multilayer disposed on the substrate, a capping layer disposed on the reflective multilayer, and an absorber layer disposed on the capping layer. The absorber layer includes one or more additional layers made of at least one selected from the group consisting of Si, B, Ge, Al, As, Sb, Te, Se and Bi. In one or more of the foregoing and following embodiments, the absorber layer includes one or more of a Cr based material, an Jr based material, a Pt based material, or Co based material. In one or more of the foregoing and following embodiments, two or more additional layers are provided, at least one of which is disposed at a bottom of the absorber layer or a top of the absorber layer. In one or more of the foregoing and following embodiments, a thickness of each of the one or more additional layers is in a range from 0.1 nm to 1 nm. In one or more of the foregoing and following embodiments, the absorber layer is patterned, and the reflective mask further comprises a protective layer disposed on sidewalls of the patterned absorber layer. In one or more of the foregoing and following embodiments, the protective layer includes a compound of at least one selected from the group consisting of Si, B, Ge, Al, As, Sb, Te, Se and Bi.

In accordance with another aspect of the present disclosure, in a method of manufacturing a reflective mask, a photo resist layer is formed over a mask blank. The mask blank includes a substrate, a reflective multilayer on the substrate, a capping layer on the reflective multilayer, an absorber layer on the capping layer and a hard mask layer. The photo resist layer is patterned, the hard mask layer is patterned by using the patterned photo resist layer, the absorber layer is patterned by using the patterned hard mask layer, and the hard mask layer is removed. The absorber layer includes a base material, and further contains one or more additional elements selected from the group consisting of Si, B, Ge, Al, As, Sb, Te, Se and Bi, which are not included in the base material. In one or more of the foregoing and following embodiments, the base material is made of one or more of a Cr based material, an Ir based material, a Pt based material, or Co based material. In one or more of the foregoing and following embodiments, during the patterning the absorber layer, a protective layer is formed on an etched sidewall of the absorber layer to suppress lateral etching of the absorber layer. In one or more of the foregoing and following embodiments, the protective layer includes a compound of the one or more additional elements. In one or more of the foregoing and following embodiments, the protective layer includes an oxide of the one or more additional elements. In one or more of the foregoing and following embodiments, the absorber layer is patterned by plasm dry etching using a gas containing oxygen. In one or more of the foregoing and following embodiments, the plasm dry etching further uses a gas containing chlorine.

In accordance with another aspect of the present disclosure, in a method of manufacturing a reflective mask, a photo resist layer is formed over a mask blank. The mask blank includes a substrate, a reflective multilayer on the substrate, a capping layer on the reflective multilayer, an intermediate layer on the capping layer, an absorber layer on the intermediate layer and a hard mask layer. The photo resist layer is patterned, the hard mask layer is patterned by using the patterned photo resist layer, the absorber layer is patterned by using the patterned hard mask layer, and the hard mask layer is removed. The intermediate layer includes a layer of one or more additional elements selected from the group consisting of Si, B, Ge, Al, As, Sb, Te, Se and Bi. In one or more of the foregoing and following embodiments, the base material is made of one or more of a Cr based material, an Ir based material, a Pt based material, or Co based material. In one or more of the foregoing and following embodiments, the one or more additional elements are not a constituent element of the absorber layer. In one or more of the foregoing and following embodiments, during an over etching step of the patterning the absorber layer, a protective layer is formed on an etched sidewall of the absorber layer to suppress lateral etching of the absorber layer. In one or more of the foregoing and following embodiments, the protective layer includes an oxide of the one or more additional elements. In one or more of the foregoing and following embodiments, the absorber layer is patterned by plasm dry etching using a gas containing oxygen. In one or more of the foregoing and following embodiments, the plasm dry etching further uses a gas containing chlorine.

In accordance with another aspect of the present disclosure, in a method of manufacturing a reflective mask, a photo resist layer is formed over a mask blank. The mask blank includes a substrate, a reflective multilayer on the substrate, a capping layer on the reflective multilayer, an absorber layer on the capping layer and a hard mask layer. The photo resist layer is patterned, the hard mask layer is patterned by using the patterned photo resist layer, the absorber layer is patterned by using the patterned hard mask layer, and the hard mask layer is removed. During the patterning the absorber layer, a protective layer is formed on an etched sidewall of the absorber layer to suppress lateral etching of the absorber layer. In one or more of the foregoing and following embodiments, the absorber layer includes one or more of a Cr based material, an Ir based material, a Pt based material, or Co based material. In one or more of the foregoing and following embodiments, the protective layer includes a compound of one or more additional elements selected from the group consisting of Si, B, Ge, Al, As, Sb, Te, Se and Bi. In one or more of the foregoing and following embodiments, the one or more additional element are supplied form the absorber layer. In one or more of the foregoing and following embodiments, the one or more additional elements are supplied from an intermediate layer disposed between the capping layer and the absorber layer. In one or more of the foregoing and following embodiments, the absorber layer is patterned by plasm dry etching using a gas containing oxygen.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A reflective mask, comprising:
a substrate;
a reflective multilayer disposed on the substrate;
a capping layer disposed on the reflective multilayer; and
an absorber layer disposed on the capping layer;
wherein the absorber layer includes a base layer and multiple intermediate layers disposed in or on the base layer, and
the multiple intermediate layers are made of at least one selected from the group consisting of Si, B, Ge, Al, As, Sb, Te, Se and Bi.

2. The reflective mask of claim 1, wherein the base layer includes one or more of a Cr-based material, an Ir-based material, a Pt-based material, or a Co-based material.

3. The reflective mask of claim 1, wherein one of the multiple intermediate layers is disposed at a bottom of the absorber layer and one of the multiple intermediate layers is disposed at a top of the absorber layer.

4. The reflective mask of claim 1, wherein a thickness of each of the multiple intermediate layers is in a range from 0.1 nm to 1 nm.

5. The reflective mask of claim 1, wherein:
the absorber layer is patterned, and
the reflective mask further comprises a protective layer disposed on sidewalls of the patterned absorber layer.

6. The reflective mask of claim 5, wherein the protective layer includes a compound of at least one selected from the group consisting of Si, B, Ge, Al, As, Sb, Te, Se and Bi.

7. The reflective mask of claim 1, wherein at least one of the multiple intermediate layers is made of a different material than another of the multiple intermediate layers.

8. The reflective mask of claim 1, wherein a thicknesses of at least one of the multiple intermediate layers is different from a thickness of another of the multiple intermediate layers.

9. A method of manufacturing a reflective mask, the method comprising:
forming a photo resist layer over a mask blank, the mask blank including a substrate, a reflective multilayer on the substrate, a capping layer on the reflective multilayer, an absorber layer on the capping layer and a hard mask layer;
patterning the photo resist layer;
patterning the hard mask layer by using the patterned photo resist layer as a mask;
patterning the absorber layer by using the patterned hard mask layer as a mask; and
removing the hard mask layer,
wherein the absorber layer includes a base material layer, and the base material layer further contains one or more additional elements selected from the group consisting of Si, B, Ge, Al, As, Sb, Te, Se and Bi, which are not included in the base material layer.

10. The method of claim 9, wherein the base material layer is made of one or more of a Cr-based material, an Ir-based material, a Pt-based material, or a Co-based material.

11. The method of claim 10, wherein during the patterning the absorber layer, a protective layer is formed on an etched sidewall of the absorber layer to suppress lateral etching of the absorber layer.

12. The method of claim 11, wherein the protective layer includes a compound of the one or more additional elements.

13. The method of claim 11, wherein the protective layer includes an oxide of the one or more additional elements.

14. The method of claim 11, wherein the absorber layer is patterned by plasma dry etching using a gas containing oxygen.

15. The method of claim 14, wherein the plasma dry etching further uses a gas containing chlorine.

16. A method of manufacturing a reflective mask, the method comprising:
    forming a photo resist layer over a mask blank, the mask blank including a substrate, a reflective multilayer on the substrate, a capping layer on the reflective multilayer, an intermediate layer on the capping layer, an absorber layer on the intermediate layer and a hard mask layer;
    patterning the photo resist layer;
    patterning the hard mask layer by using the patterned photo resist layer as a mask;
    patterning the absorber layer by using the patterned hard mask layer as a mask; and
    removing the hard mask layer,
    wherein the intermediate layer includes a layer of one or more additional elements selected from the group consisting of Si, Ge, Al, As, Se and Bi.

17. The method of claim 16, wherein the absorber layer comprises a base material made of one or more of a Cr-based material, an Ir-based material, a Pt-based material, or a Co-based material.

18. The method of claim 17, wherein the one or more additional elements are not a constituent element of the absorber layer.

19. The method of claim 18, wherein during an over etching step of the patterning the absorber layer, a protective layer is formed on an etched sidewall of the absorber layer to suppress lateral etching of the absorber layer.

20. The method of claim 19, wherein the protective layer includes an oxide of the one or more additional elements.

* * * * *